(12) United States Patent
Kashimura et al.

(10) Patent No.: US 9,281,314 B1
(45) Date of Patent: Mar. 8, 2016

(54) NON-VOLATILE STORAGE HAVING OXIDE/NITRIDE SIDEWALL

(71) Applicant: SanDisk Technologies Inc., Plano, TX (US)

(72) Inventors: Takashi Kashimura, Yokkaichi (JP); Xiaolong Hu, Yokkaichi (JP); Sayako Nagamine, Yokkaichi (JP); Yusuke Yoshida, Yokkaichi (JP); Hiroaki Iuchi, Nagoya (JP); Akira Nakada, Yokkaichi (JP); Kazutaka Yoshizawa, Kuwana (JP)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/511,834

(22) Filed: Oct. 10, 2014

(51) Int. Cl.
| | |
|---|---|
| *H01L 29/792* | (2006.01) |
| *H01L 21/336* | (2006.01) |
| *H01L 27/115* | (2006.01) |
| *H01L 21/768* | (2006.01) |
| *H01L 23/528* | (2006.01) |
| *H01L 23/532* | (2006.01) |
| *H01L 21/285* | (2006.01) |
| *H01L 21/28* | (2006.01) |
| *H01L 21/02* | (2006.01) |
| *H01L 21/764* | (2006.01) |
| *H01L 21/311* | (2006.01) |

(52) U.S. Cl.
CPC ........ *H01L 27/1157* (2013.01); *H01L 21/0217* (2013.01); *H01L 21/02164* (2013.01); *H01L 21/02271* (2013.01); *H01L 21/28273* (2013.01); *H01L 21/28282* (2013.01); *H01L 21/28568* (2013.01); *H01L 21/31111* (2013.01); *H01L 21/764* (2013.01); *H01L 21/768* (2013.01); *H01L 23/528* (2013.01); *H01L 23/53257* (2013.01); *H01L 27/11524* (2013.01); *H01L 27/11526* (2013.01); *H01L 27/11573* (2013.01)

(58) Field of Classification Search
CPC ...................... H01L 27/1157; H01L 27/11524
USPC ........................................... 257/324; 438/257
See application file for complete search history.

(56) References Cited

U.S. PATENT DOCUMENTS

| | | | |
|---|---|---|---|
| 4,971,655 | A | 11/1990 | Stefano et al. |
| 6,734,097 | B2 | 5/2004 | Iggulden et al. |
| 7,821,059 | B2 | 10/2010 | Shingu et al. |
| 8,449,942 | B2 | 5/2013 | Liang et al. |
| 8,492,224 | B2 | 7/2013 | Purayath et al. |
| 2015/0318296 | A1 * | 11/2015 | Kim .................. H01L 27/11573 257/296 |
| 2015/0340371 | A1 * | 11/2015 | Lue ...................... H01L 27/1158 257/324 |

* cited by examiner

*Primary Examiner* — David S Blum
(74) *Attorney, Agent, or Firm* — Vierra Magen Marcus LLP

(57) ABSTRACT

Non-volatile storage devices and methods for fabricating non-volatile storage device are described. Sidewalls of the memory cells and their associated word line may be covered with silicon oxide. Silicon nitride covers the silicon oxide adjacent to the word lines, which may provide protection for the word lines during fabrication. However, silicon nitride can trap charges, which can degrade operation if the trapped charges are near a charge trapping region of a memory cell. Thus, the silicon nitride does not cover the silicon oxide adjacent to charge storage regions of the memory cells, which can improve device operation. For example, memory cell current may be increased. Techniques for forming such a device are also disclosed. One aspect includes a method that uses a sacrificial material to control formation of a silicon nitride layer when forming a memory device.

19 Claims, 16 Drawing Sheets

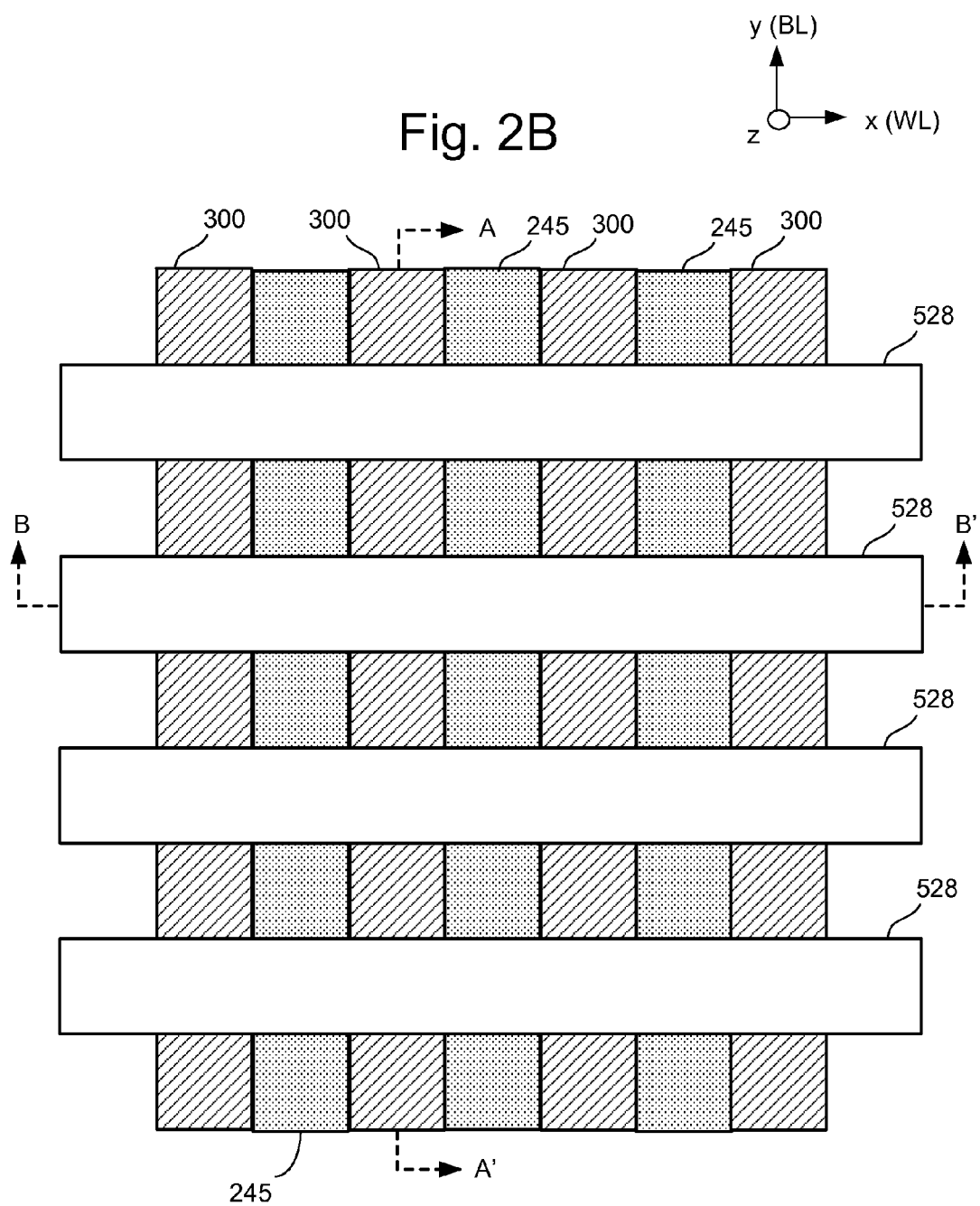

NON-VOLATILE STORAGE HAVING OXIDE/NITRIDE SIDEWALL

BACKGROUND

This disclosure relates to non-volatile storage.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to traditional EEPROM.

BRIEF DESCRIPTION OF THE DRAWINGS

FIG. 2B is a top view of a portion of an array of NAND flash memory cells.

DETAILED DESCRIPTION

Disclosed herein are non-volatile storage devices and methods for fabricating non-volatile storage devices. With ever decreasing size of features, combating breakdown voltage can be difficult. One type of voltage breakdown occurs between neighboring word lines. As the distance between word lines decreases, breakdown voltage may become a greater problem. Moreover, some conventional techniques for combating breakdown voltage lead to other problems, such as undesirably trapping charges in dielectric materials. These trapped charges can impair device performance. Further details are discussed below.

One embodiment includes a memory device having memory cells associated with a word line. Sidewalls of the memory cells and the word line may be covered with silicon oxide. Silicon nitride covers the silicon oxide adjacent to the word lines, which may provide protection for the word lines during fabrication. However, silicon nitride can trap charges, which can degrade operation if the trapped charges are near a charge trapping region of a memory cell. Thus, the silicon nitride does not cover the silicon oxide adjacent to charge storage regions of the memory cells, which can improve device operation. For example, memory cell current may be increased. Techniques for forming such a device are also disclosed.

One embodiment includes a method that uses a sacrificial material to control formation of a silicon nitride layer when forming a memory device. Lines of memory cell stacks are formed. Each stack has a word line and associated memory cells. Silicon oxide is formed on sidewalls of the lines of the memory cell stacks. A sacrificial material is formed between the lines of the memory cell stacks after forming the silicon oxide. The top of the sacrificial material is below the word lines but above charge storage regions of the memory cells. Thus, a portion of the silicon oxide remains exposed after forming the sacrificial material. Silicon nitride is formed on the sidewalls of the exposed silicon oxide. The sacrificial material is removed while leaving the silicon oxide on the sidewalls of the lines of memory cell stacks and the silicon nitride on the sidewalls of the silicon oxide adjacent to the word lines. Air gaps are formed between neighboring pairs of the lines of memory cell stacks. Advantageously, the location of the silicon nitride can be accurately controlled. Also, the air gap can be formed in the space vacated by the sacrificial material. The air gap provides for good electrical isolation and high voltage breakdown between the word lines.

Figure 1:
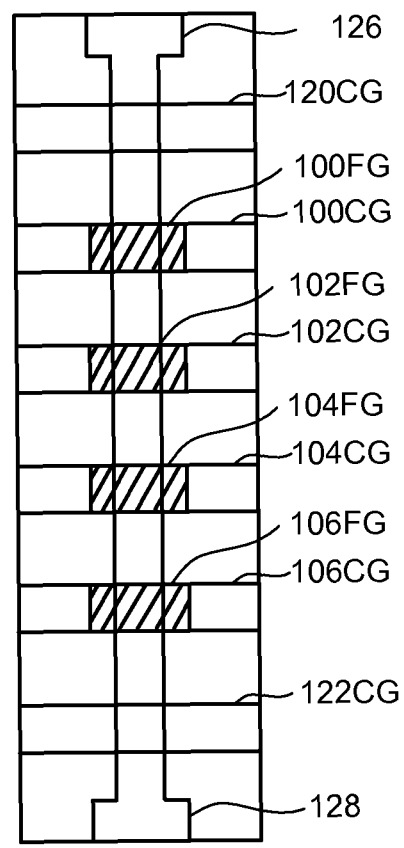
FIG. 1 is a top view of a NAND string.

The techniques described herein are applicable to wide range of memory arrays having memory cells. The following is one example NAND architecture. However, technology disclosed herein is not limited to this example. One example of a flash memory system uses the NAND structure, which includes arranging multiple floating gate transistors in series between two select gate transistors. The memory cells and select gate transistors in series are referred to as a NAND string. FIG. 1 is a top view showing one NAND string. The NAND string depicted in FIG. 1 includes four memory cell transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

A typical architecture for a flash memory system using a NAND structure will include many NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Figure 2A:
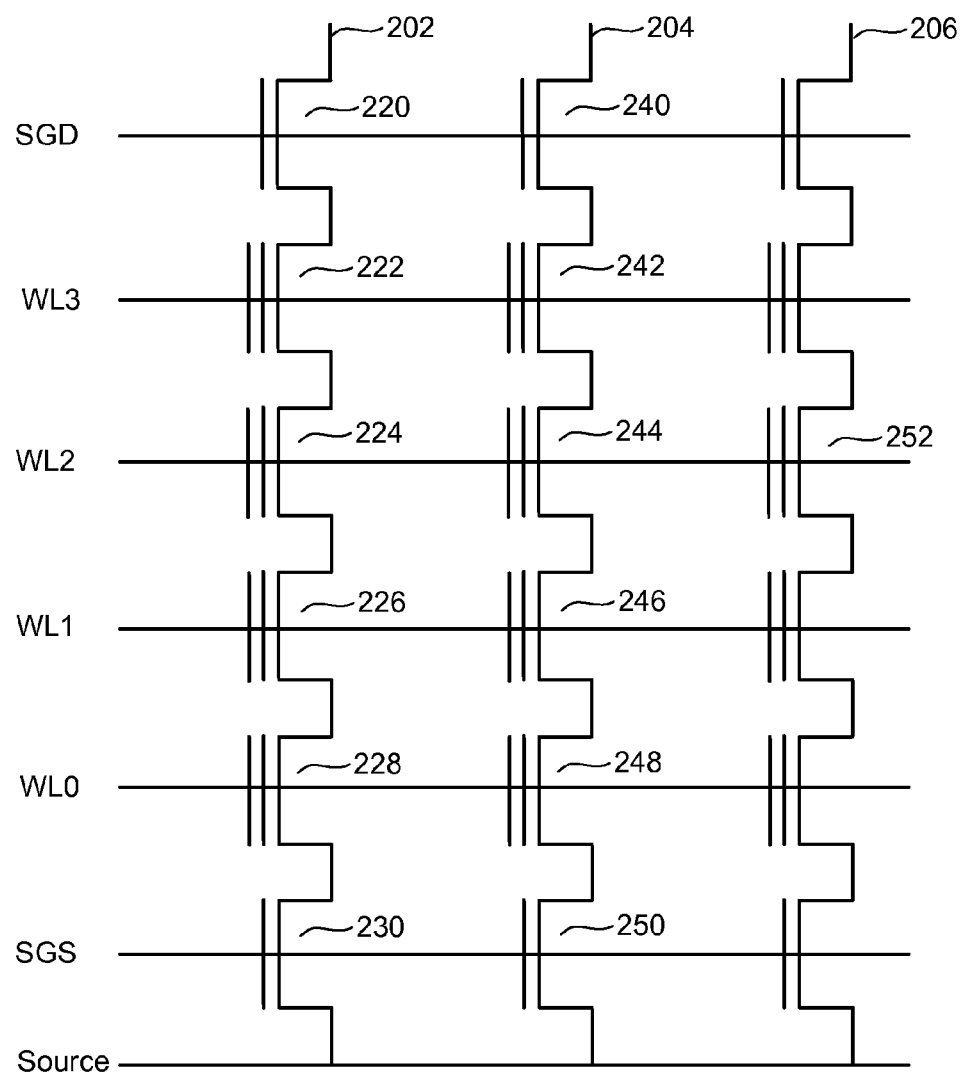
FIG. 2A shows three NAND strings of a memory array having many more NAND strings.

FIG. 2A shows three NAND strings 202, 204 and 206 of a memory array having many more NAND strings. Each of the NAND strings of FIG. 2A includes two select transistors and four memory cells. For example, NAND string 202 includes select transistors 220 and 230, and memory cells 222, 224, 226 and 228. NAND string 204 includes select transistors 240 and 250, and memory cells 242, 244, 246 and 248. Each NAND string is connected to the source line by its select transistor (e.g. select transistor 230 and select transistor 250). A selection line SGS is used to control the source side select gates. The various NAND strings are connected to respective bit lines (not depicted in FIG. 2A) by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224, memory cell 244, and memory cell 252. Word line WL1 is connected to the control gates for memory cell 226 and memory cell 246. Word line WL0 is connected to the control gates for memory cell 228 and memory cell 248. As can be seen, each bit line and the respective NAND string comprise the columns of the array of memory cells. The word lines (WL3, WL2, WL1 and WL0) comprise the rows of the array.

Note that a NAND string can have fewer or more memory cells than depicted in FIG. 2A. For example, some NAND strings will include eight memory cells, 16 memory cells, 32 memory cells, 64 memory cells, 128 memory cells, etc. The discussion herein is not limited to any particular number of memory cells in a NAND string. Furthermore, a word line can have more or fewer memory cells than depicted in FIG. 2A. For example, a word line can include thousand or tens of thousands of memory cells. The discussion herein is not limited to any particular number of memory cells in a word line.

FIG. 2B is a top view of a portion of an array of NAND flash memory cells. The array includes NAND strings 300 and word lines 528. Shallow trench isolation (STI) structures 245 are depicted between the NAND strings 300. The STI structures 245 provide electrical isolation between adjacent NAND strings 300. In one embodiment, the STI structures 245 are formed from silicon oxide. In one embodiment, electrical isolation between adjacent NAND strings 300 is provided by the use of air gaps. These may be referred to a "bit line air gaps" due to their orientation relative to the direction of the bit lines (which may extend in the same direction as the NAND strings 300. A coordinate system is depicted showing: x or word line (WL) direction, y or bit line (BL) direction, and z-direction. It is not required that the word lines and bit lines are perpendicular to each other. Note that FIG. 2B does not show all of the other details of the flash memory cells.

Note that a NAND string can have fewer or more memory cells than depicted in FIGS. 2A and 2B. For example, some NAND strings will include eight memory cells, 16 memory cells, 32 memory cells, 64 memory cells, 128 memory cells, etc. The discussion herein is not limited to any particular number of memory cells in a NAND string. Furthermore, a word line can be associated with more or fewer memory cells than depicted in FIGS. 2A and 2B. For example, a word line can be associated with thousands or tens of thousands of memory cells. The discussion herein is not limited to any particular number of memory cells in a word line.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

The discussion herein can also apply to other types of flash memory in addition to NAND as well as other types of non-volatile memory. For example, NOR type flash memories may be used. Also, a so called TANOS structure (consisting of a stacked layer of TaN—Al$_2$O$_3$—SiN—SiO$_2$ on a silicon substrate), which is basically a memory cell using trapping of charge in a nitride layer (instead of a floating gate), can also be used. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. Other types of memory devices can also be used.

Figure 3:
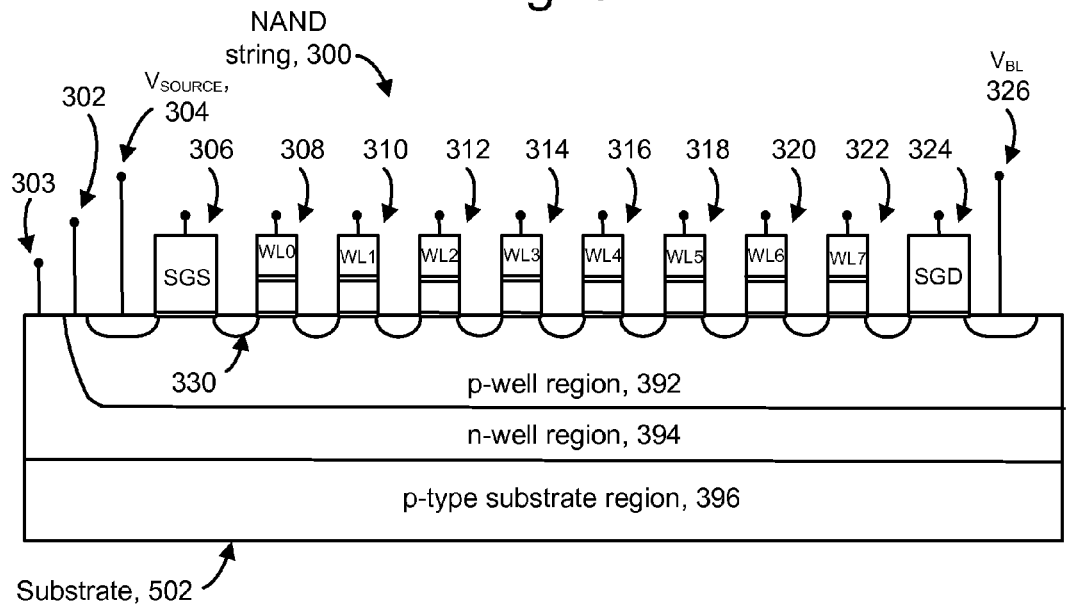
FIG. 3 depicts a cross-sectional view of an NAND string formed on a substrate.

FIG. 3 depicts a cross-sectional view of an NAND string formed on a substrate. The view is simplified and not to scale. The NAND string 300 includes a source-side select gate 306, a drain-side select gate 324, and eight storage elements 308, 310, 312, 314, 316, 318, 320 and 322, formed on a substrate 502. A number of source/drain regions, one example of which is source drain/region 330, are provided on either side of each storage element and the select gates 306 and 324. In one approach, the substrate 502 employs a triple-well technology which includes a p-well region 392 within an n-well region 394, which in turn is within a p-type substrate region 396. The NAND string and its non-volatile storage elements can be formed, at least in part, on the p-well region 392. A source supply line 304 with a potential of VsouRcE is provided in addition to a bit line 326 with a potential of VBL. Further, the control gate of a storage element may be provided as a portion of the word line. For example, WL0, WL1, WL2, WL3, WL4, WL5, WL6 and WL7 can extend via the control gates of storage elements 308, 310, 312, 314, 316, 318, 320 and 322, respectively.

Figure 4:
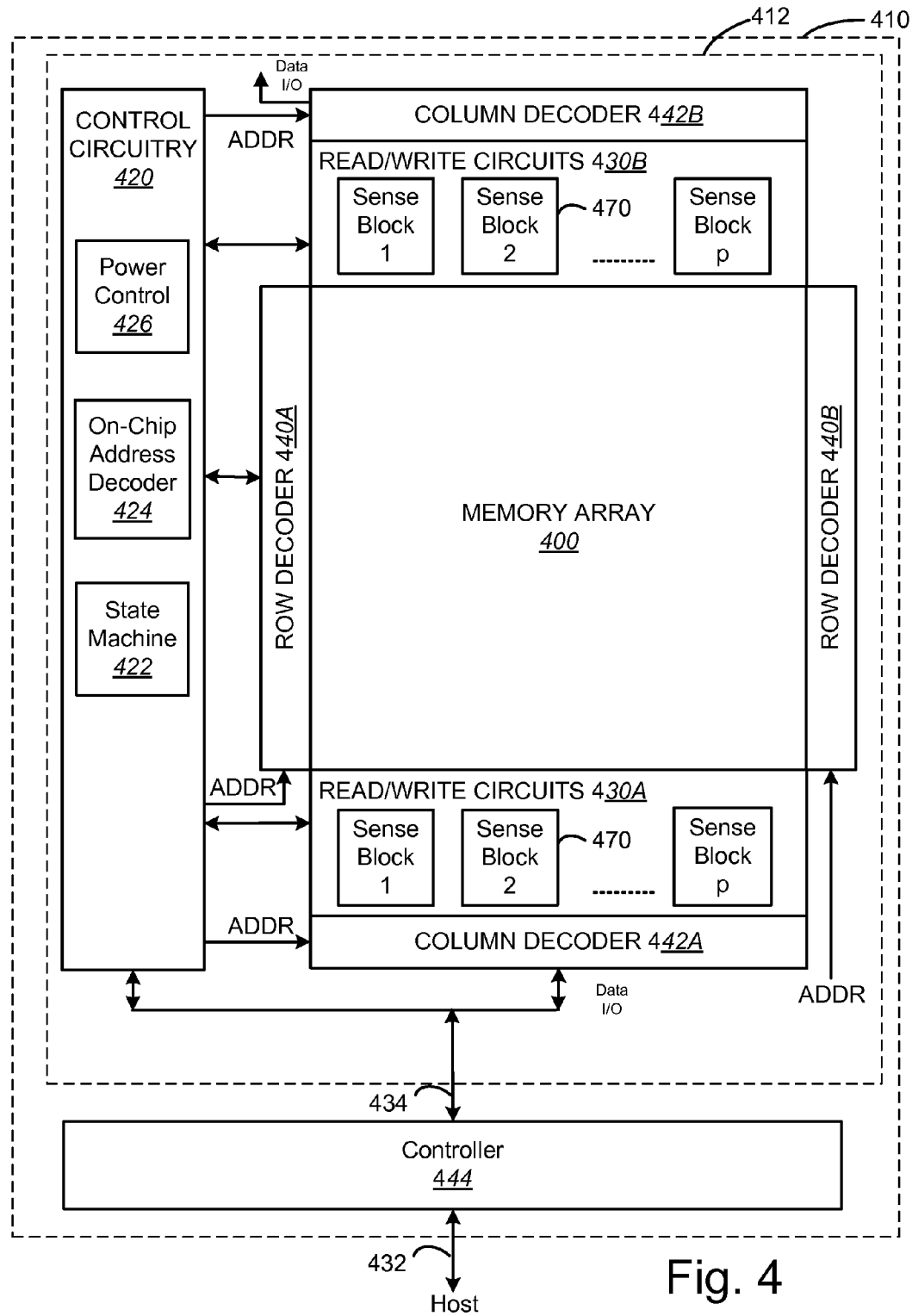
FIG. 4 illustrates a non-volatile storage device that may include one or more memory die or chips.

FIG. 4 illustrates a non-volatile storage device 410 that may include one or more memory die or chips 412. Memory die 412 includes an array (two-dimensional or three dimensional) of memory cells 400, control circuitry 420, and read/write circuits 430A and 430B. In one embodiment, access to the memory array 400 by the various peripheral circuits is implemented in a symmetric fashion, on opposite sides of the array, so that the densities of access lines and circuitry on each side are reduced by half. The read/write circuits 430A and 430B include multiple sense blocks 470 which allow a page of memory cells to be read or programmed in parallel. The memory array 400 is addressable by word lines via row decoders 440A and 440B and by bit lines via column decoders 442A and 442B. In a typical embodiment, a controller 444 is included in the same memory device 410 (e.g., a removable storage card or package) as the one or more memory die 412. Commands and data are transferred between the host and controller 444 via lines 432 and between the controller and the one or more memory die 412 via lines 434. One implementation can include multiple chips 412.

Control circuitry 420 cooperates with the read/write circuits 430A and 430B to perform memory operations on the memory array 400. The control circuitry 420 includes a state machine 422, an on-chip address decoder 424 and a power control module 426. The state machine 422 provides chip-level control of memory operations. The on-chip address decoder 424 provides an address interface to convert between the address that is used by the host or a memory controller to the hardware address used by the decoders 440A, 440B, 442A, and 442B. The power control module 426 controls the power and voltages supplied to the word lines and bit lines during memory operations. In one embodiment, power control module 426 includes one or more charge pumps that can create voltages larger than the supply voltage.

In one embodiment, one or any combination of control circuitry 420, power control circuit 426, decoder circuit 424, state machine circuit 422, decoder circuit 442A, decoder circuit 442B, decoder circuit 440A, decoder circuit 440B, read/write circuits 430A, read/write circuits 430B, and/or controller 444 can be referred to as one or more managing circuits.

Figure 5A:
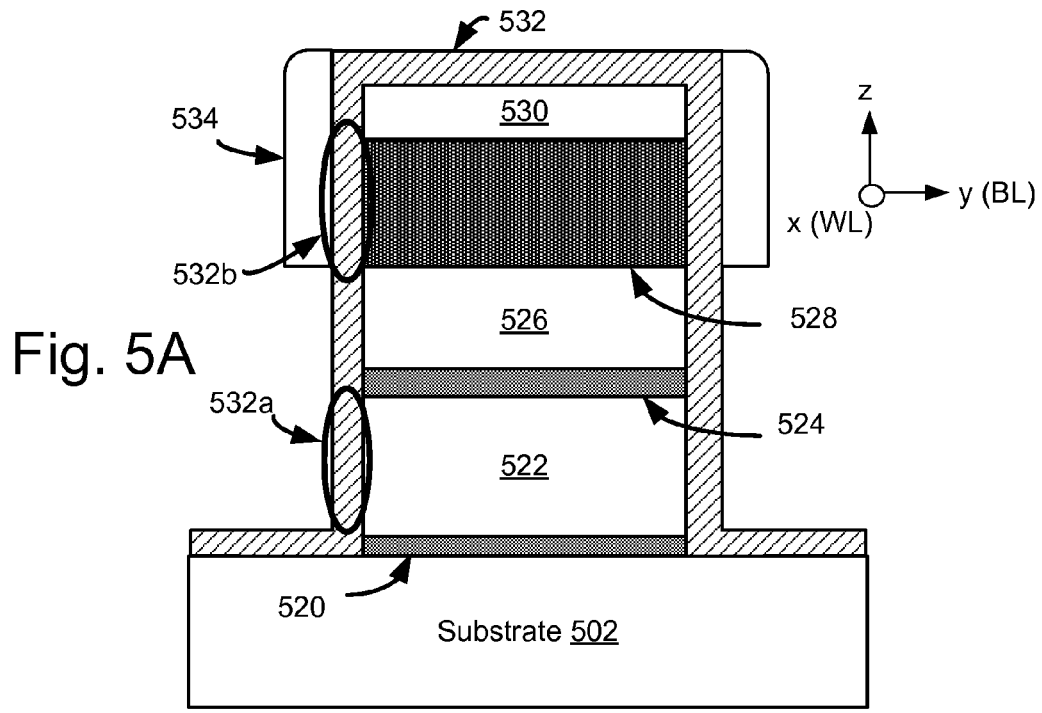
FIG. 5A is a diagram of a memory cell and portion of a word line of one embodiment.

FIG. 5A is a diagram of a memory cell and portion of a word line of one embodiment. The memory cell is formed on substrate 502 and includes a charge storage region 522. In one embodiment, the charge storage region 522 is a conductive floating gate. For example, the floating gate can be formed from polysilicon. The memory cell also includes a control gate 526, which may be formed from polysilicon. There is a gate or tunnel oxide 520 between the charge storage region 522 and the substrate 502. The tunnel oxide 520 may be formed from silicon oxide. There is an intermediate dielectric 524 between the charge storage region 522 and the control gate 526. In one embodiment, the intermediate dielectric 524 is formed from multiple layers, such as silicon oxide/silicon nitride/silicon oxide ("ONO"). Such an ONO layer could be referred to as an inter-gate or inter-poly dielectric (IPD). There is a word line 528 over the control gate 526. In one embodiment, the word line 528 is formed from tungsten. The word line 528 could be formed from a different metal. Region 530 comprises $SiH_4$ in one embodiment. Region 530 could be a different material. In one embodiment, region 530 is used as a mask when etching to form the word line 528 and layers below the word line.

It is not required that the charge storage region 522 be a conductive floating gate. In one embodiment, the charge storage region 522 includes a dielectric charge trapping region. For example, the dielectric charge trapping region can be formed from silicon nitride. The silicon nitride region may be part of a triple layer dielectric formed of silicon oxide, silicon nitride and silicon oxide ("ONO") is sandwiched between the conductive control gate 526 and the substrate 502. In such a configuration, intermediate dielectric 524 may be a blocking layer, which could comprise silicon oxide, as one example. Region 520 may be a tunnel oxide of, for example, silicon oxide.

There is a silicon oxide layer 532 over sidewalls of the memory cell, as well as over the sidewalls of the word line 528. The sidewalls of the memory cell and word line that are covered by the silicon oxide layer 532 may have a surface in the x-y plane. This may be a conformal layer. As used herein, the term "covered" may include direct physical contact, but does not require direct physical contact. The silicon oxide layer 532 has a first region 532a adjacent to the charge storage region 522 and a second region 532b adjacent to the word line 528. These first and second regions 532a, 532b are roughly depicted by the circled areas. The silicon oxide layer 532 may be in direct contact with the sidewalls of the memory cell and word line. As used herein, the term "adjacent" does not require direct physical contact but could include direct physical contact.

Silicon nitride region 534 covers the sidewalls of the silicon oxide region 532 adjacent to the word line 528. Thus, the silicon nitride region 534 covers the second region 532b of silicon oxide. The silicon nitride region 534 may be in direct contact with silicon oxide region 532b, but direct contact is not required. The silicon nitride region 534 may provide protection for the word line 528 during memory cell formation. For example, tungsten from which the word line may be formed could be damaged during memory cell formation were it not for the protective silicon nitride 534.

However, silicon nitride region 534 does not cover the sidewalls of the silicon oxide region 532 that is adjacent to the charge trapping region 522. Thus, the silicon nitride region 534 does not cover the first region 532a of silicon oxide. In one embodiment, there is some form of electrical isolation next to region 532a. For example, the electrical isolation may include an air gap next to the first region 532a of silicon oxide 532. The electrical isolation may be in direct contact with the first region 532a of silicon oxide 532.

Figure 5B:
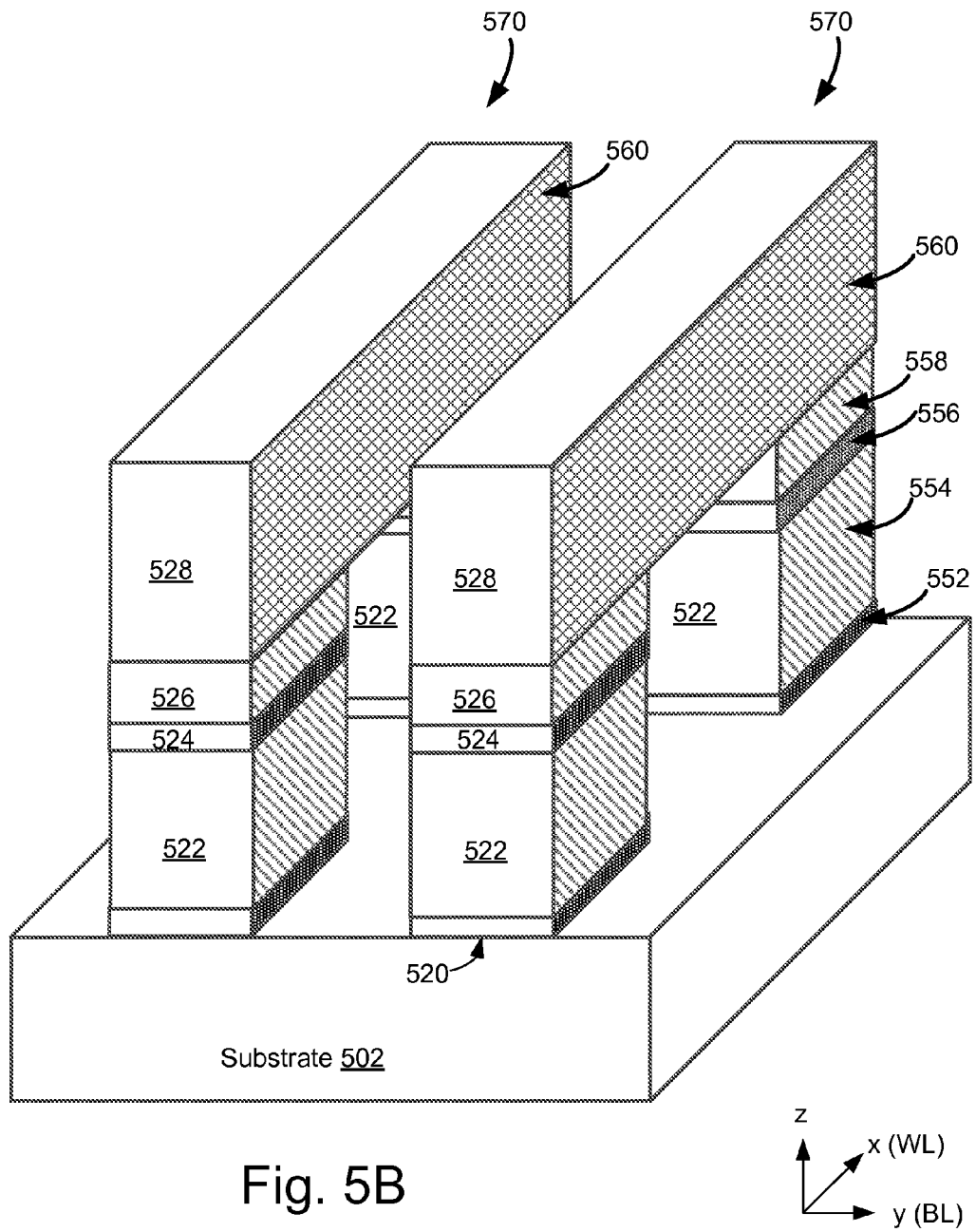
FIG. 5B is a perspective view of stacks of memory cell lines of one embodiment.

FIG. 5B depicts a diagram of four memory cells and two word lines to help illustrate the location of the sidewalls of the memory cells and the word lines. The word line and its associated memory cells may be referred to herein as a "memory cell stack" 570. The memory cell stack 570 extends in the word line direction. Thus, each line of memory cell stacks 570 comprises memory cells and a word line. Only two memory cells are shown in each line, but there are typically many more.

Each memory cell includes tunnel oxide 520, charge storage region 522, intermediate dielectric 524, and control gate

526. The tunnel oxide 520 has sidewall 552, the charge storage region 522 has sidewall 554, the intermediate dielectric 524 has sidewall 556, the control gate 526 has sidewall 558, and the word line 528 has sidewall 560. Each of these sidewalls is a surface in the x-z plane, in this example. Although not labeled, there is another set of sidewalls in the x-z plane on the opposite side of these elements. To simplify FIG. 5B, the silicon oxide layer 532 that was depicted in FIG. 5A is not depicted. Likewise, the silicon nitride layer 534 that was depicted in FIG. 5A is not depicted. The silicon oxide layer 532 may cover each of the sidewalls 552, 554, 556, 558, and 560.

FIG. 5B shows spaces between the memory cells in both the bit line and the word line direction. In one embodiment, the spaces between the memory cell stacks 570 are filled with some form of electrical isolation. A portion of this electrical isolation is the silicon oxide layer 532. Another portion of the electrical isolation may be an air gap. An air gap could be any gasses. This may be referred to as a word line air gap.

Figure 8A:
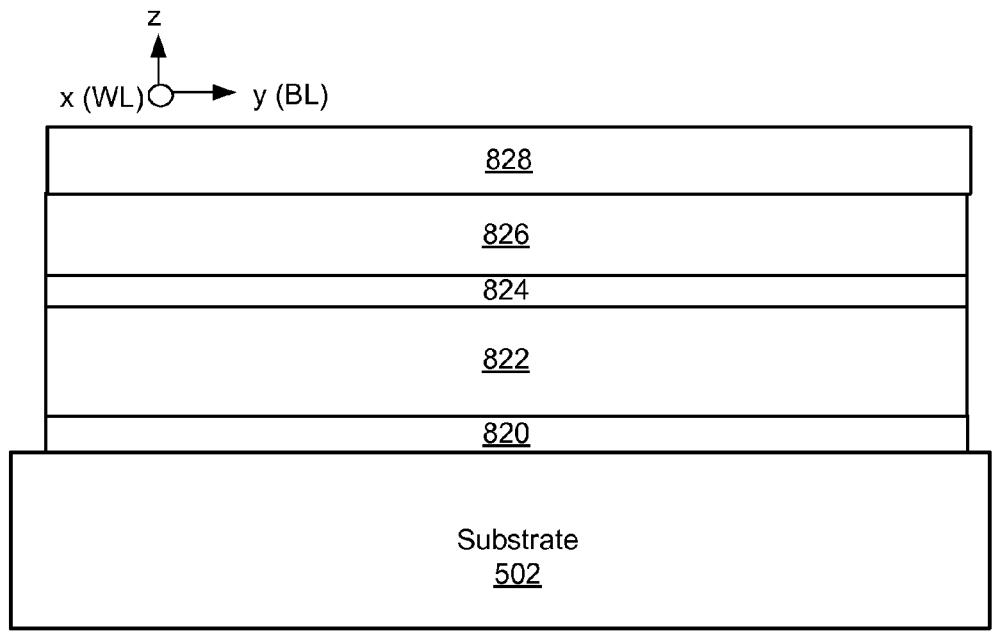
FIGS. 8A-8F depict formation after various steps in the process of FIG. 7.
Figure 8B:
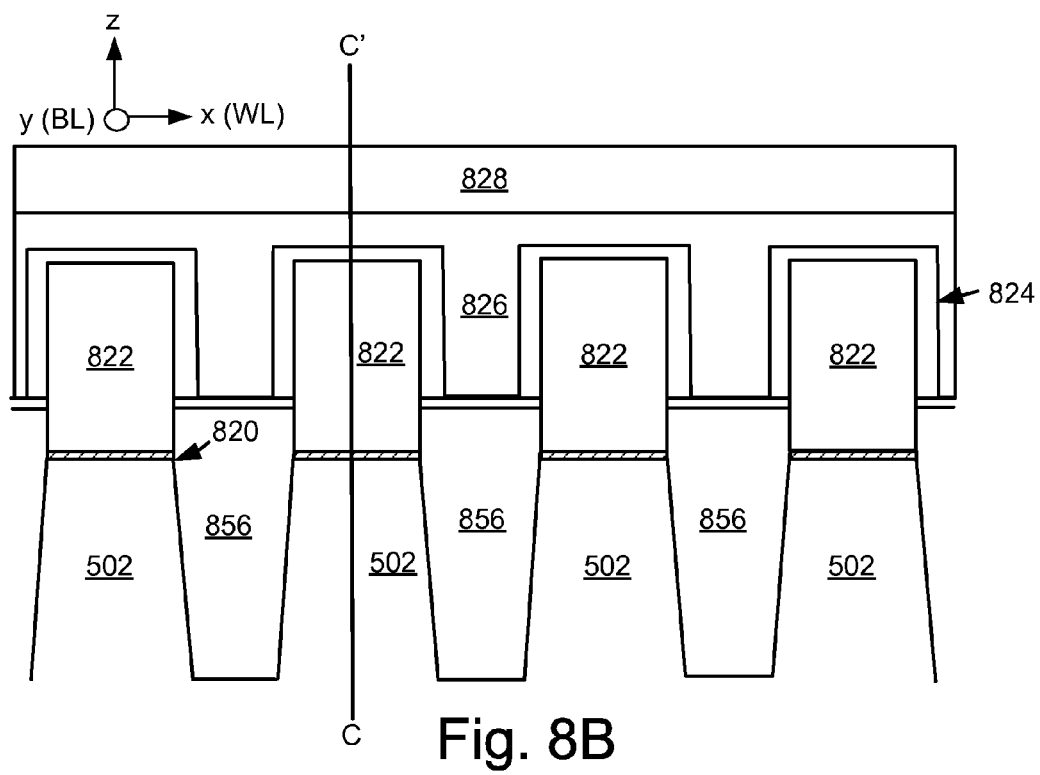

In one embodiment, the spaces beneath the word lines in the word line direction are filled with some form of electrical isolation. Another option is for the control gates 526 to extend downward such that they are near some of the sidewalls of the charge storage regions 522. For example, the control gates 526 can be near the sidewalls of the charge storage regions 522 that have a surface in the y-z plane. Note that the intermediate dielectric 524 should also extend downward to provide a dielectric between the control gate 526 and the charge storage region 522. FIG. 8B shows on example in which the control gates 826 extend downward between charge storage regions 822.

Figure 6:
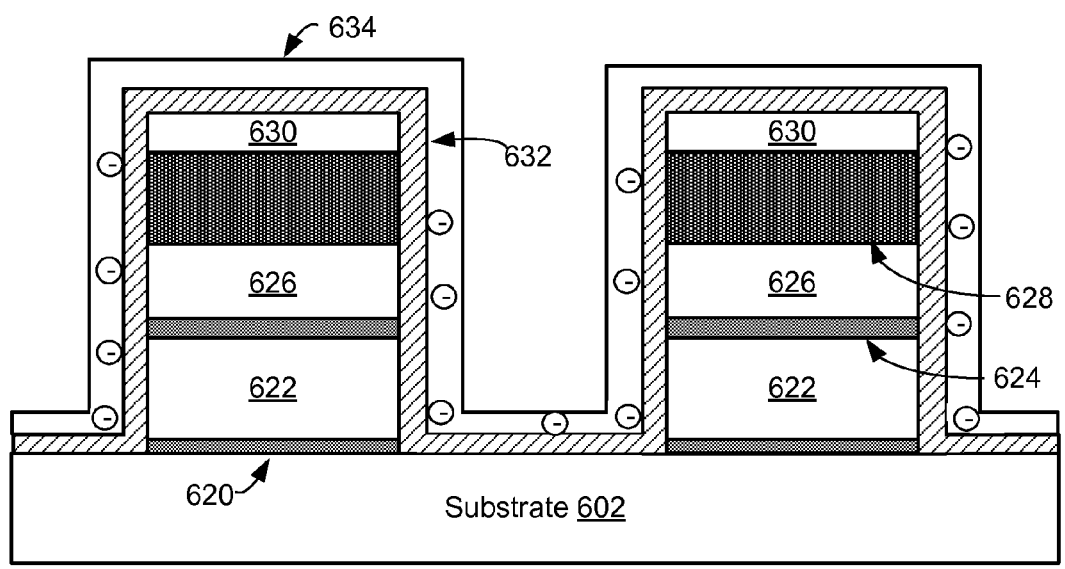
FIG. 6 shows an example in which silicon nitride covers the sidewalls of the silicon oxide that are adjacent to the charge trapping region.

As mentioned above, the silicon nitride 534 can provide protection for the word line 528 during device fabrication. However, silicon nitride 534 can trap charges, which could impair device operation. This is depicted in FIG. 6 for an example having memory cells having a tunnel oxide 620, charge storage region 622, intermediate dielectric 624, control gate 626, word line 628, and region 630. The silicon nitride 634 covers the sidewalls of the silicon oxide 632 that are adjacent to the charge storage regions 622. The trapped charges in the silicon nitride 634 can alter the neutral threshold voltage ($V_{TH}$) of the memory cell. The neutral $V_{TH}$ refers to the $V_{TH}$ when there is no net charge in the charge trapping region. For example, the trapped charges can impact the $V_{TH}$ of the memory cell.

One possible explanation for the change in neutral $V_{TH}$ is that positive charges may be generated at the edges of the charge storage region 622 near the negative charges in the silicon nitride 634 to cancel the electric field generated by the negative charges. These positive charges may, in effect, be trapped by the edges of the charge storage region 622. Even though there is not a change in net charge on the charge storage region 622 (assuming no leakage), the change in distribution of the charges in the charge storage region 622 can impact the effective charge in the charge storage region 622. Thus, the neutral $V_{TH}$ may change. For example, the neutral $V_{TH}$ may increase. An increase in the neutral $V_{TH}$ may be consistent with degradation of cell current. Thus, the charges trapped in the silicon nitride may lead to degradation in the cell current.

However, returning to the embodiment depicted in FIG. 5A, there is no silicon nitride by the first region 532a of silicon oxide. Thus, the problem of trapped charges in a silicon nitride region by the charge storage region 522 is avoided.

It is possible that there may be some trapped charges in the silicon nitride region 534 that is adjacent to the word line 528. However, the word line 528 can be connected to peripheral circuitry such as word line drivers, etc. In other words, the word line 528 is not floating or otherwise surrounded by insulation. Thus, positive charges can be provided (or negative charges removed) by the peripheral circuitry to balance out any negative charges in the silicon nitride region 534 that is adjacent to the word line 528.

Figure 7:
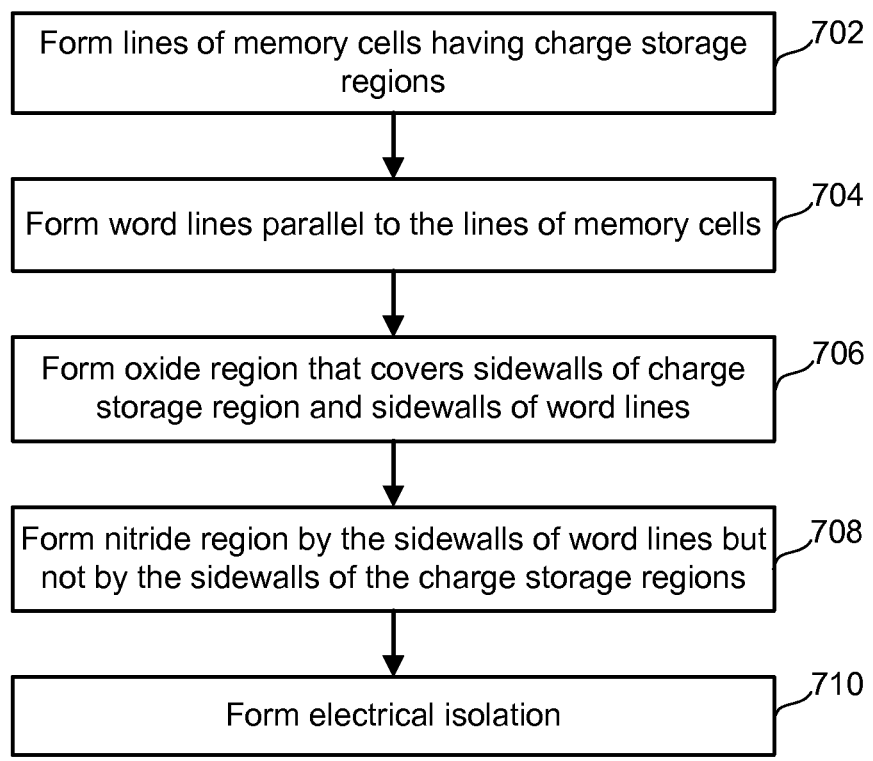
FIG. 7 is a flowchart of one embodiment of a process of fabricating memory cells.

FIG. 7 is a flowchart of one embodiment of a process of fabricating memory cells. The process can be used to form a memory cell and word line such as depicted in FIG. 5A. FIGS. 8A-8F depict formation after various steps in the process.

Figure 8C:
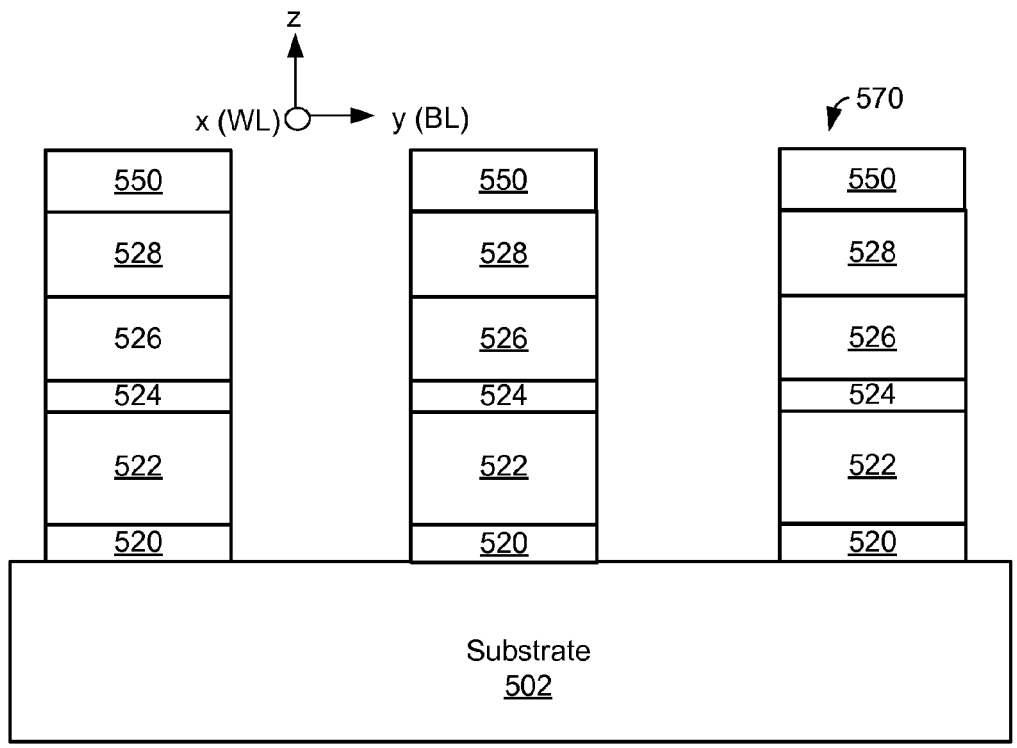

In step 702, lines of memory cells are formed. In step 704, word lines that extend parallel to the lines of memory cells are formed. FIGS. 8A-8C show one embodiment of formation of the lines of memory cells and the word lines. FIG. 8A shows a perspective along line A-A' from FIG. 2B. This may be referred to as a perspective along the NAND string. FIG. 8B shows a perspective along line B-B' from FIG. 2B. This may be referred to as a perspective along the word line. Both Figures are for the same step in fabrication.

FIG. 8A is also the line C-C' in FIG. 8B. FIG. 8A shows a substrate 502, with various layers above that including, tunnel oxide layer 820, charge storage layer 822, intermediate dielectric layer 524, control gate layer 826, and word line layer 828. The tunnel oxide layer 820 is a thin layer of oxide (e.g., $SiO_2$) grown in one embodiment, although different materials and processes can be used. Chemical vapor deposition (CVD) processes, metal organic CVD processes, physical vapor deposition (PVD) processes, atomic layer deposition (ALD) processes, thermal oxidation or other suitable techniques can be used. In one example, the tunnel oxide layer is formed to a thickness of about 8 nanometers (nm).

The charge storage layer 822 is a polysilicon floating gate layer in one embodiment. The vertical dimension (with respect to the substrate surface) or thickness of the charge storage layer can vary by embodiment. In one embodiment, the charge storage layer 822 has a vertical dimension of 10 nm. In another embodiment, the charge storage layer has a vertical dimension of 70-80 nm. The charge storage layer could have other vertical dimensions.

Dielectric charge storage materials, metal and non-metal nanostructures (e.g., carbon) can also be used for the charge storage layer 822. In one embodiment, the charge storage layer 822 is a metal layer forming a charge-trap type floating gate layer. A thin metal charge-trap type floating gate layer can reduce concerns with ballistic charge programming issues that may arise with conventional polysilicon floating gates. In one embodiment, a metal floating gate layer is formed to a thickness of between 5 nm and 10 nm. In another embodiment, metal thicknesses less than 5 nm are used. Thicknesses greater than 10 nm might also be used. In one embodiment, the layer of charge storage material comprises nano-particles. In one embodiment, the metal floating gate layer is a high work function metal. In one example, the metal is ruthenium. Other metals such as palladium, platinum, rhodium, titanium, tungsten, tantalum, nickel, cobalt, etc., and their alloys (e.g., TiN, WN, TaN, NiSi, CoSi, WSix) can be used.

The intermediate dielectric layer 822 is a triple layer of oxide, nitride and oxide (ONO) in one embodiment. In one embodiment, a high-K (dielectric constant) material is used for the intermediate dielectric to reduce or eliminate charge transfer through the intermediate layer while providing enhanced control gate to floating gate coupling.

FIG. 8B shows four memory cells, each of which is on a different NAND string. Region 856 is electrical isolation that is provided between the NAND strings. In one embodiment, this is an air gap. Another option for the electrical isolation is shallow trench isolation (STI) structures, which could be formed from silicon oxide, tetra-ethyl ortho-silicate (TEOS), as examples.

FIG. 8B shows that at this point in fabrication, charge storage layer 822 has been etched into lines that extend in the y- or bit line-direction in accordance with a first pattern. However, etching in the x- or word line-direction has not yet been done (as indicated by FIG. 8A). The first pattern corresponds to intended columns of the memory array and may be repetitive in the row or direction of the x-axis. The pattern also corresponds to intended active areas of the substrate 502 which are separated by isolation regions 856. Spacer-assisted patterning, nano-imprint patterning, and other patterning techniques can also be used to form strips at reduced feature sizes. The pattern may define a first direction of etching to form columns of the memory array.

In this example, the control gate layer 826 extends downward such that it is not only above the charge storage layer 822, but is also adjacent to the sidewalls of the charge storage layer 822. This may improve capacitive coupling between the two regions, but is not a requirement. Also, although the control gate 826 is depicted as a contiguous region, this is not required. For example, each memory cell could have its own separate control gate. FIG. 5B depicted an example in which each memory cell has its own separate control gate.

After etching in the y- or bit line direction, a second etch is performed in the x- or word line direction. This forms the word lines and finalizes the shapes of the memory cells. FIG. 8C is a diagram after etching has been performed in the x- or word line-direction. FIG. 8C is similar to 8A in that it shows perspective along line A-A' from FIG. 2B. In one embodiment, region 550 is used as a mask to etch the word line layers and layers below that to form the structure of FIG. 8C.

Thus, at this point in the fabrication process, lines of memory cell stacks 570 have been formed. A line of memory cell stacks 570 extends in the x- or word line-direction, as depicted in FIG. 8B (or FIG. 5B). The word lines 528 are parallel to the lines of memory cells. Each word line 528 is coupled to the control gates 526 of the memory cells. A word line 528 may be in direct contact with a control gate 526. The structures in FIG. 8C may be referred to as "memory cell stacks". A memory cell stack may include a line of memory cells and a word line. Note that the structures in FIG. 8C may be similar to the structures of FIG. 5B.

Figure 8D:
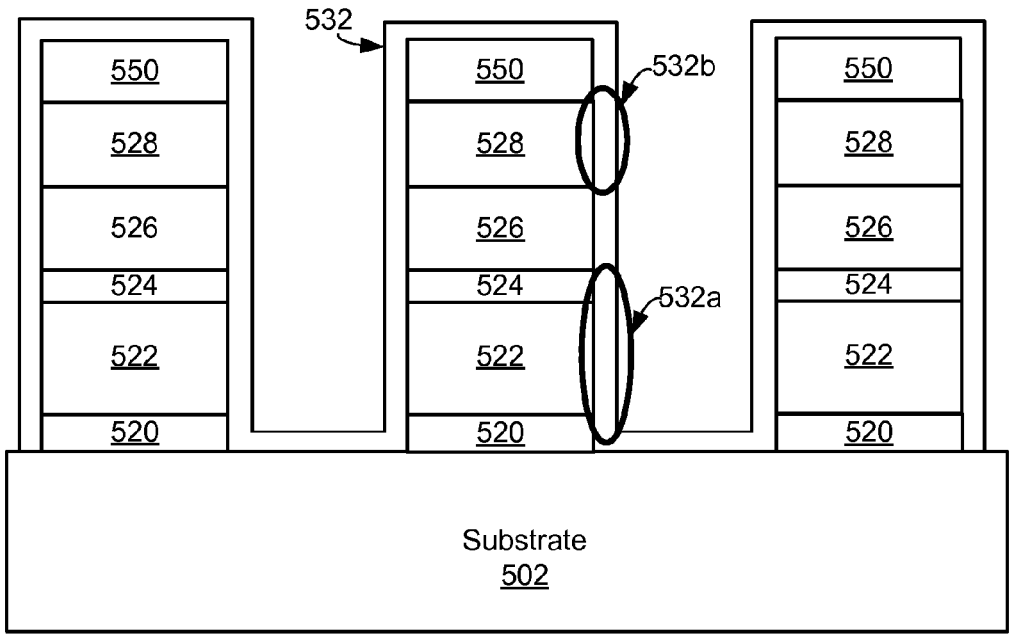

In step 706, oxide is formed that covers the sidewalls 554 of the charge storage region and the sidewalls 560 of the word lines. This oxide may cover other sidewalls such as sidewalls 552, 558, 558 of the tunnel oxide 520, intermediate dielectric 524 and control gate 526. In one embodiment, the oxide formed in step 706 is silicon oxide. FIG. 8D shows results after one embodiment of step 706, with oxide (e.g., silicon oxide) covering the sidewalls of the memory cell stacks. Region 532a of the oxide 532 covers sidewalls of the charge storage region 522, and region 532b of oxide 532 covers sidewalls of the word lines 528. The oxide 532 may cover other sidewalls such as sidewalls of the tunnel oxide 520, intermediate dielectric 524 and control gate 526. The oxide 532 may also cover a portion of the substrate 502, such as over the source/drain (S/D) regions 827.

The oxide 532 may be provided using different approaches, including oxidizing the sidewalls, depositing an oxide on the sidewalls, or a combination of these two approaches. For sidewall oxidation, the device may be placed in a furnace at a high temperature (e.g., over 1000 degrees Celsius) and with some fractional percentage of ambient oxygen gas, so that the exposed surfaces oxidize. An alternative to high temperature oxide growth is low temperature (e.g., 400 degrees Celsius) oxide growth in high density Krypton plasma.

In step 708, nitride is formed by the sidewalls 566 of the word lines 528, but not by the sidewalls 554 of the charge storage regions 552. In one embodiment, this is silicon nitride. In one embodiment, the silicon nitride is formed using low pressure chemical vapor deposition (LPCVD) technology. In one embodiment, the silicon nitride is formed using plasma-enhanced chemical vapor deposition (PECVD) technology.

Figure 8E:
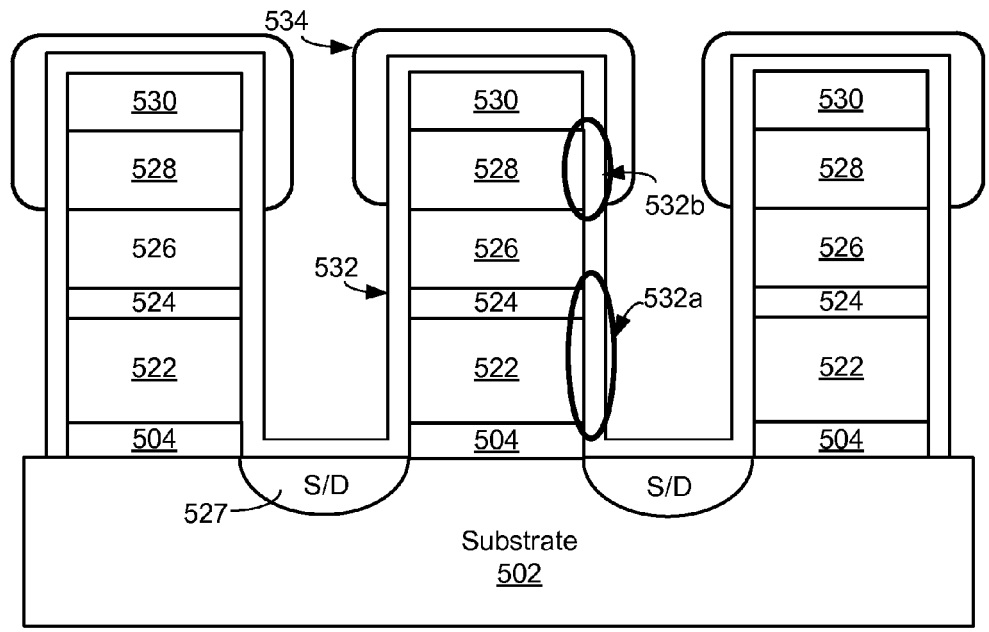

FIG. 8E shows results after one embodiment of step 708, with nitride 534 (e.g., silicon nitride) covering the sidewalls of the oxide by the word lines 528. However, the nitride 534 does not cover the sidewalls of the oxide 532 by the charge storage region 522. For example, region 532a of silicon oxide is not covered by the nitride 534. Thus, region 532a of silicon oxide is exposed at this point.

In one embodiment, silicon nitride 534 is formed by depositing it with poor step coverage. For example, by deliberately having poor step coverage, regions 532b adjacent to the sidewalls of the word lines 528 are covered by the nitride. However, regions 532a of the oxide that is adjacent to the charge storage regions 522 are not covered by the nitride. This provides for the structure depicted in FIG. 8E, which shows the nitride 534 covering the silicon oxide 532 by the word line 528. Also, source/drain (S/D) regions 527 have been formed in the substrate 502 by implanting a suitable dopant.

In step 710, electrical isolation is formed between the word lines and memory cells. In one embodiment, step 710 forms electrical isolation regions other than silicon nitride adjacent to the oxide regions 532a that cover the sidewalls of the charge storage regions 522. An electrical isolation region may include an air gap and possibly a solid material in contact with the silicon oxide 532.

Figure 8F:
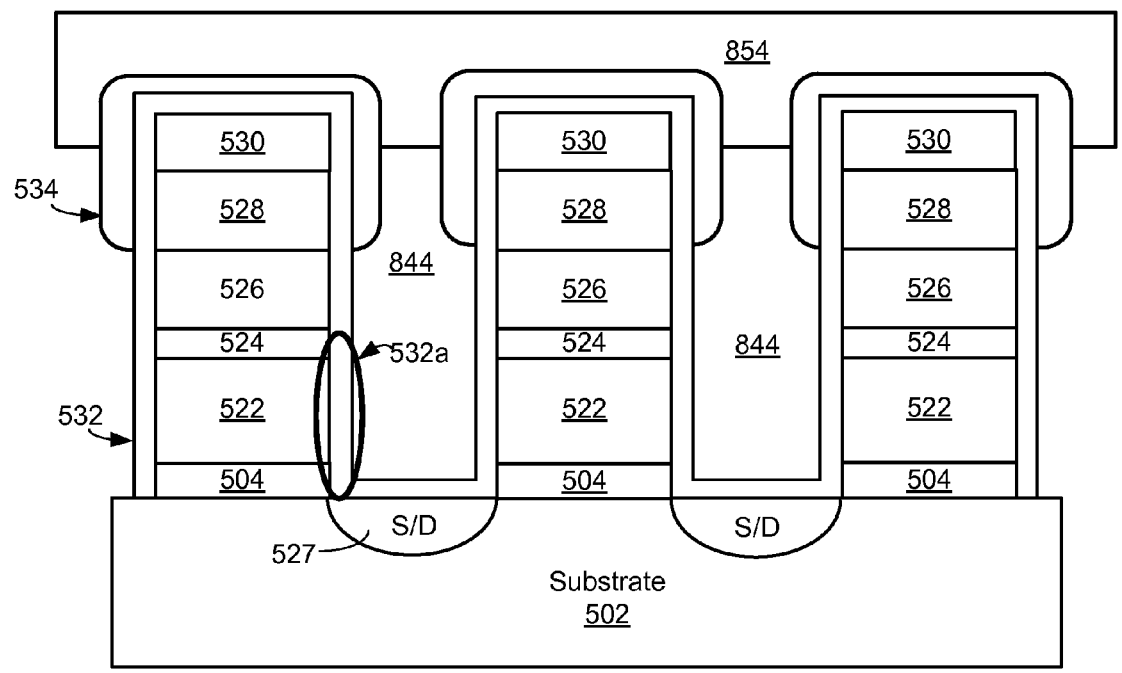

Thus, step 710 may include forming air gaps between pairs of neighboring word lines. These air gaps may be adjacent to the region 532a of the oxide 532 that is by the charge storage regions 522. FIG. 8F shows results after one embodiment of step 710, showing air gaps 844 between pairs of adjacent word lines 528. Step 710 may include forming a capping layer 854 over the word lines 528. In one embodiment, capping layer is silicon oxide. Capping layer 854 may be formed using a plasma SiH4 process, as one example. Gases such as air and process gases fill the space between the memory cell stacks 570, resulting in the air gaps.

The air gap 844 is present adjacent to the region 532a of the oxide that itself is adjacent to the charge storage region 522. The air gap 844 may be in direct contact with region 532a of the silicon oxide 532. However, there could be an insulator other than silicon nitride in direct contact with region 532a. For example, there might be a thin layer of an insulator other than silicon nitride in direct contact with region 532a. Thus, it is not required that the air gap 844 occupy the entire space between the memory cells stacks. These air gaps 844 may be referred to as "word line air gaps" due to their orientation being parallel with respect to the word lines.

Figure 9:
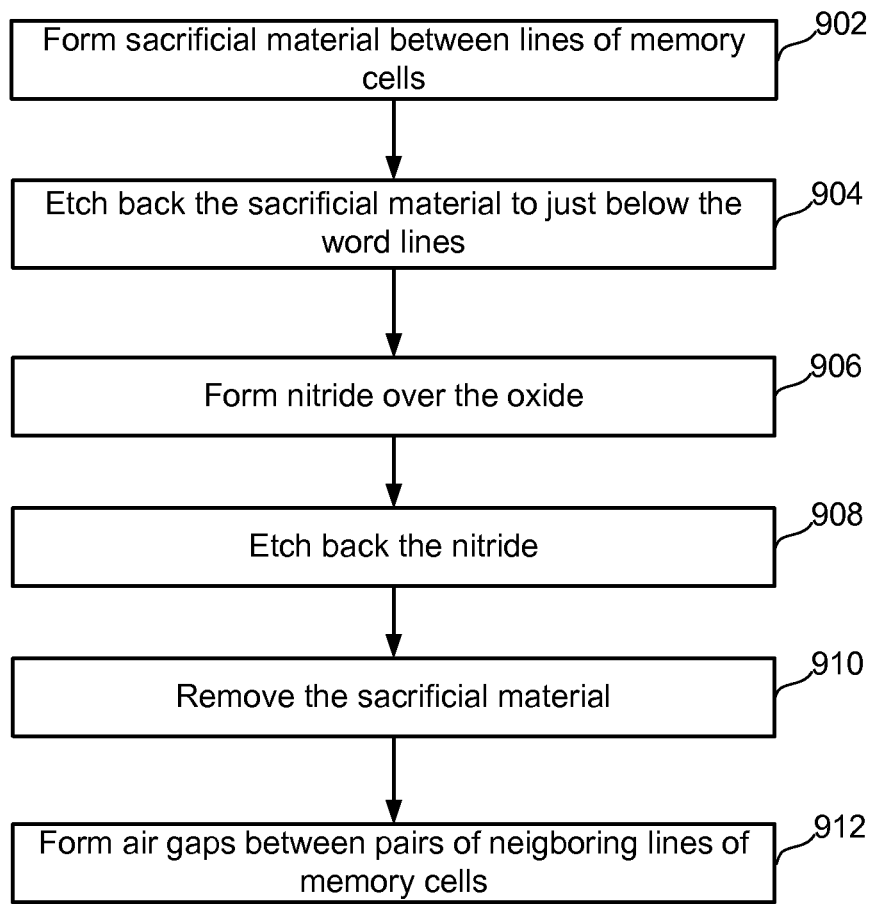
FIG. 9 is a flowchart of one embodiment of a process of fabricating a silicon nitride region.

FIG. 9 is a flowchart of one embodiment of a process of fabricating a silicon nitride region 534. This process is one embodiment of step 708 from FIG. 7. FIGS. 10A-10F show results during one embodiment of this process. In step 902, sacrificial material is formed between lines of memory cells. Prior to step 902, a structure similar to the one depicted in FIG. 8D may be formed.

Figure 10A:
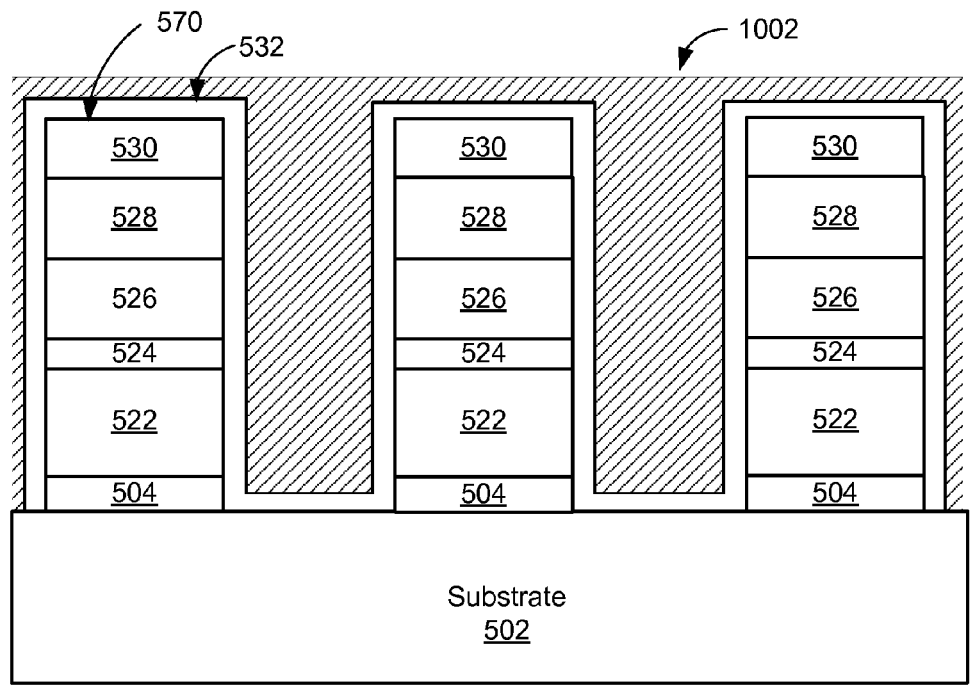
FIGS. 10A-10F depict formation after various steps in the process of FIG. 9.

FIG. 10A depicts results after one embodiment of step 902, showing sacrificial material 1002 filled in between the memory cell stacks 570 (which at this point have been covered with silicon oxide 532). In one embodiment, the sacrificial materials is a flowable CVD film. This film can be formed using a high-density plasma CVD system, a plasma enhanced CVD system, and/or a sub-atmospheric CVD system, among other systems. Examples of CVD systems capable of forming a flowable or flow-like layer include the ULTIMA HDP CVD® system and ETERNA CVD® on the PRODUCER® system, both available from Applied Materials, Inc., of Santa Clara, Calif. Other CVD systems from other manufacturers may also be used.

In one embodiment, forming the sacrificial material 1002 comprises depositing silicon, nitrogen, and hydrogen. In one embodiment, the sacrificial material 1002 is a material that could be cured by annealing in an oxygen environment to form silicon oxide. However, annealing in an oxygen environment is not performed in one embodiment. Thus, the sacrificial material 1002 is not converted to silicon oxide, in one embodiment.

The sacrificial material 1002 has a high etch selectivity with respect to silicon oxide in one embodiment. Thus, the sacrificial material 1002 has a high etch selectivity with respect to the silicon oxide 532, in one embodiment. As one example, the etch selectively could be about 10:1, but this is just one example. The sacrificial material 1002 may also have a high etch selectivity with respect to silicon nitride (e.g., silicon nitride 534) in one embodiment.

Figure 10B:
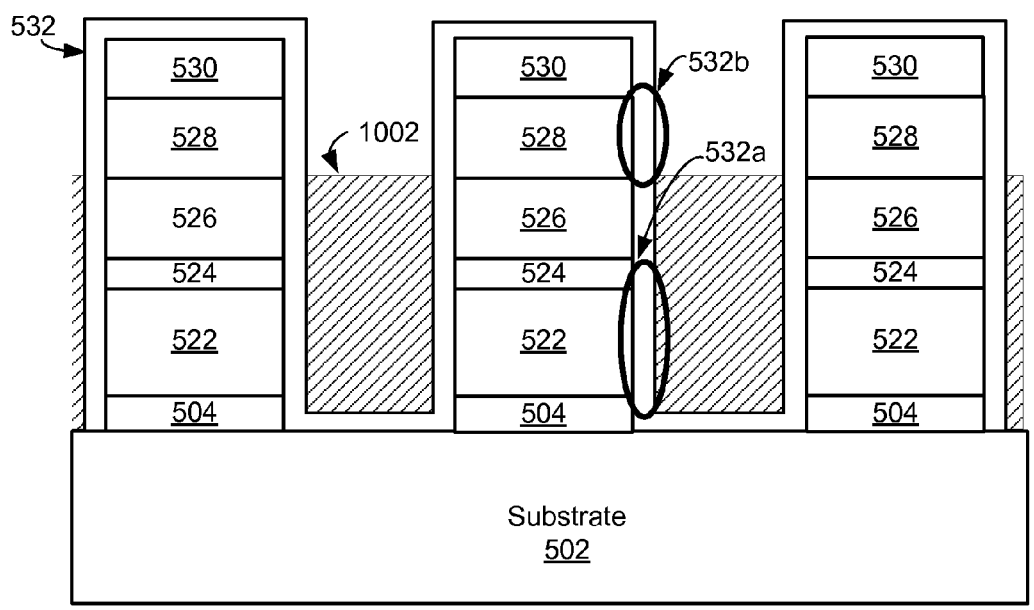

In step 904, the sacrificial material 1002 is etched back to a level that at the bottom of or just below the word lines 528. FIG. 10B shows results after one embodiment of step 904. The top surface of the sacrificial material 1002 is below the word lines 528. However, the top surface of the sacrificial material 1002 is above the charge storage regions 522. Stated another way, the sacrificial material 1002 covers the sidewalls of the region 532a of the silicon oxide where the silicon oxide itself covers the sidewalls of the charge storage regions 522. However, the sacrificial material 1002 does not cover the sidewalls of the region 532b of the silicon oxide where the silicon oxide itself covers the sidewalls of the word lines 528.

In step 906, silicon nitride is formed over the exposed silicon oxide. In one embodiment, the silicon nitride is formed using low pressure chemical vapor deposition (LPCVD) technology. In one embodiment, the silicon nitride is formed using plasma-enhanced chemical vapor deposition (PECVD) technology.

Figure 10C:
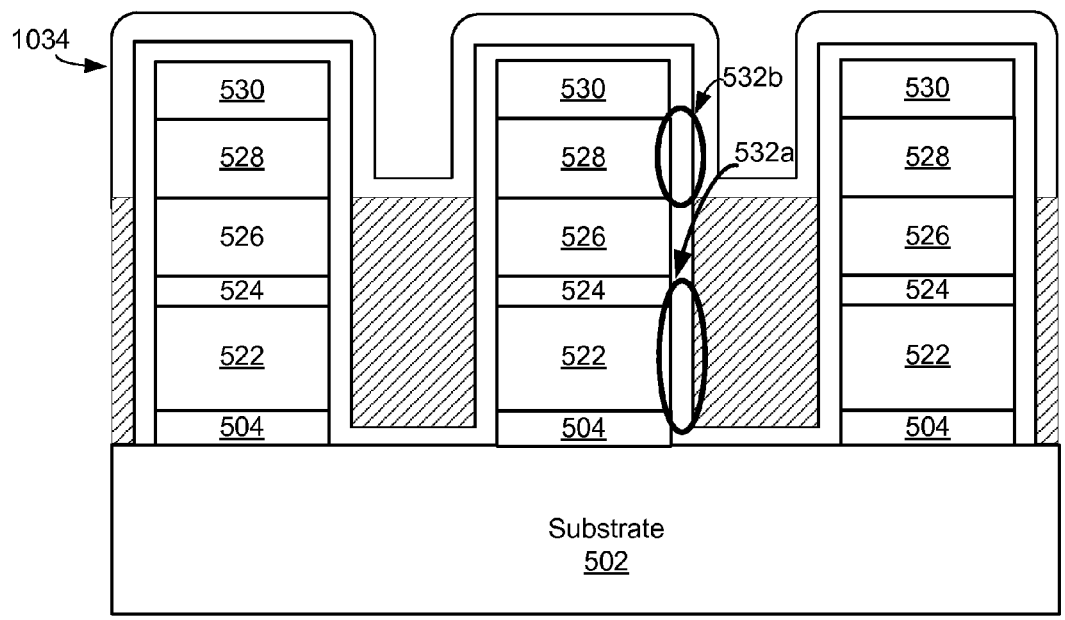

FIG. 10C depicts results after one embodiment, showing silicon nitride 1034. The silicon nitride 1034 may be a conformal layer over the exposed silicon oxide 532. The silicon nitride 1034 covers the sidewalls of the regions 532b of the silicon oxide 532 that itself covers the sidewalls of the word lines 528. At this point in the fabrication, there is also some silicon nitride 1034 over the top surface of the sacrificial material 1002. Also, there is also some silicon nitride 1034 over the tops of the memory cell stacks.

Figure 10D:
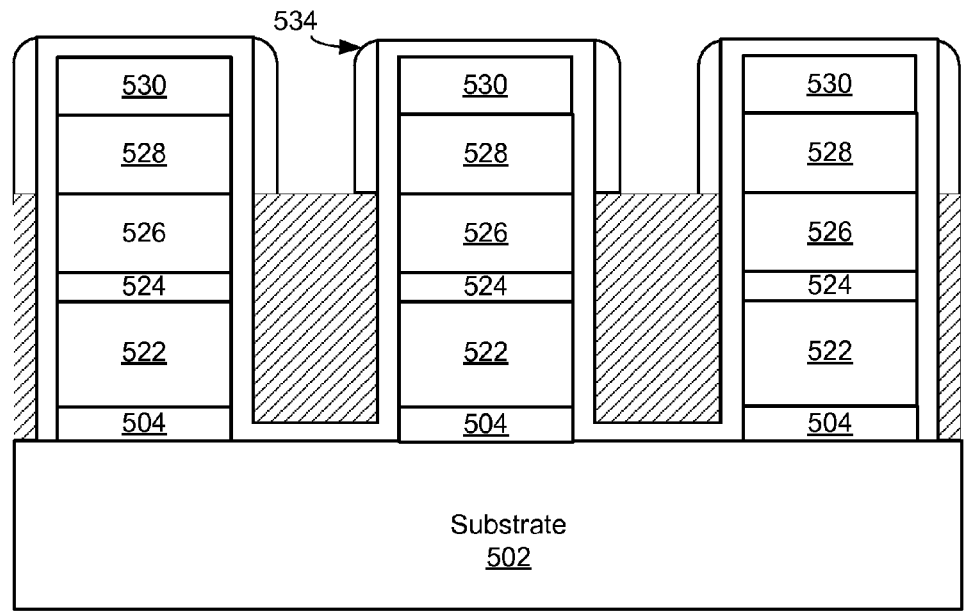

In step 908, the silicon nitride 1034 is etched back. FIG. 10D depicts results after one embodiment of step 908. The silicon nitride 534 may now be described as being sidewall spacers. The portions of the silicon nitride that were above the memory cell stacks 570 has been removed, as well as most of the portions of the silicon nitride 1034 that was over the top surface of the sacrificial material 1002.

Figure 10E:
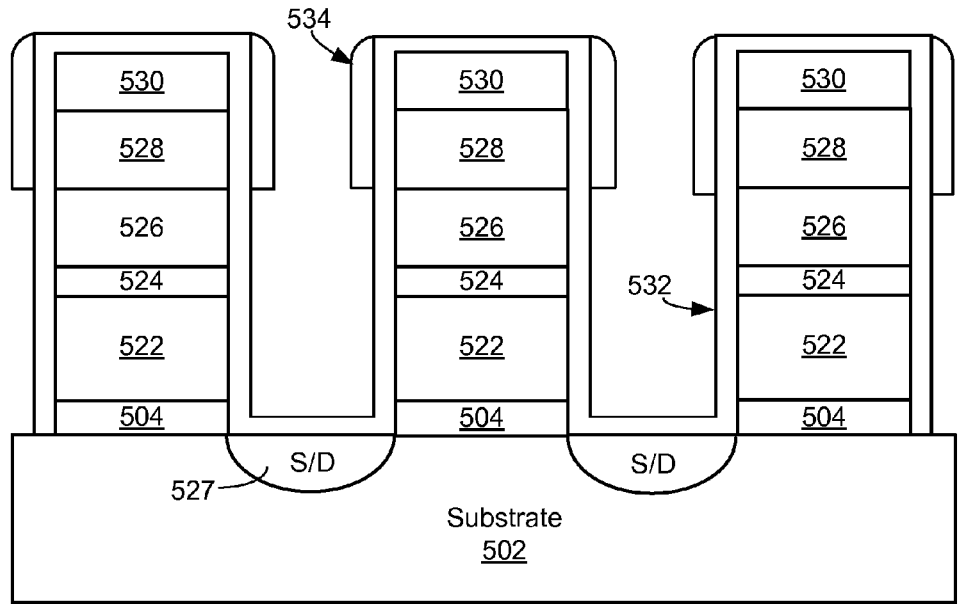

In step 910, the sacrificial material is removed. FIG. 10E depicts results after step 910, showing that the sacrificial material is now removed. This step may involve performing a selective etch that etches the sacrificial material but not the silicon oxide 532. Likewise, the silicon nitride 534 is not removed, in one embodiment. Source/drain (S/D) regions 527 have also been formed by implanting a suitable dopant. The S/D regions 527 could be formed at a different point in the process.

Figure 10F:
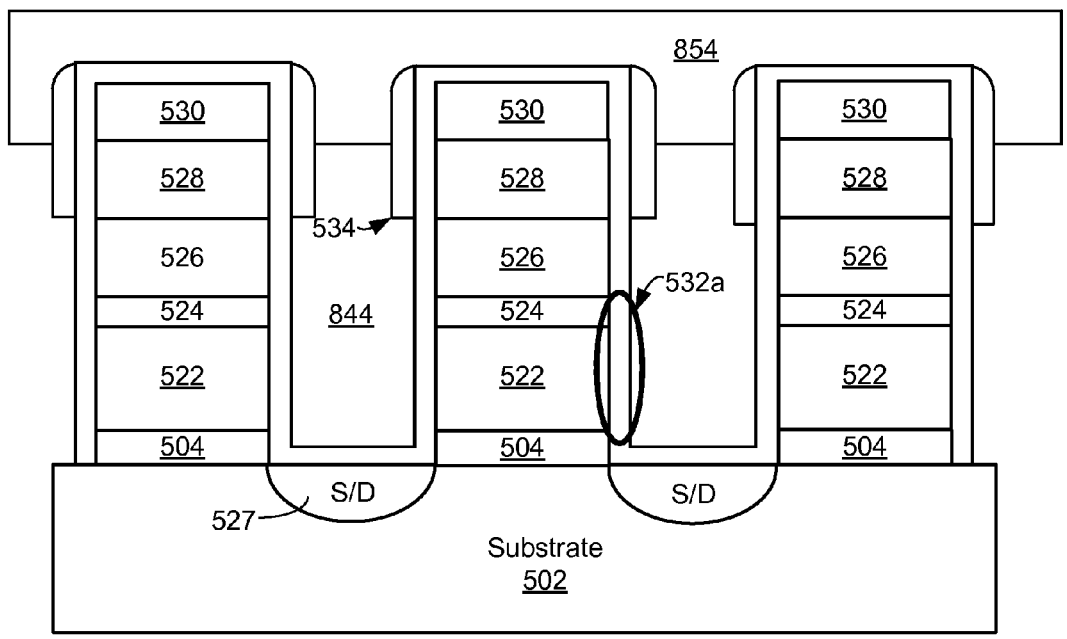

In step 912, air gaps are formed between pairs of neighboring lines of memory cells. FIG. 10F depicts results after step 912. A layer of, for example, Sift has been formed as a capping layer 854 over the memory cell stacks. In one embodiment, an $SiH_4$ plasma process is used to form the capping layer 854. This results in formation of air gaps 844 between the word lines 528. A portion of the air gap 844 is adjacent to the region 532a of the silicon oxide 532 that is adjacent to the charge storage region 522. The air gap 844 may be in direct contact with region 532a of the silicon oxide 532. However, there could be a solid material other than silicon nitride in direct contact with region 532a. For example, there might be a thin layer of an insulator other than silicon nitride in direct contact with region 532a. Thus, it is not required that the air gap 844 occupy the entire space between the memory cells stacks.

Figure 11:
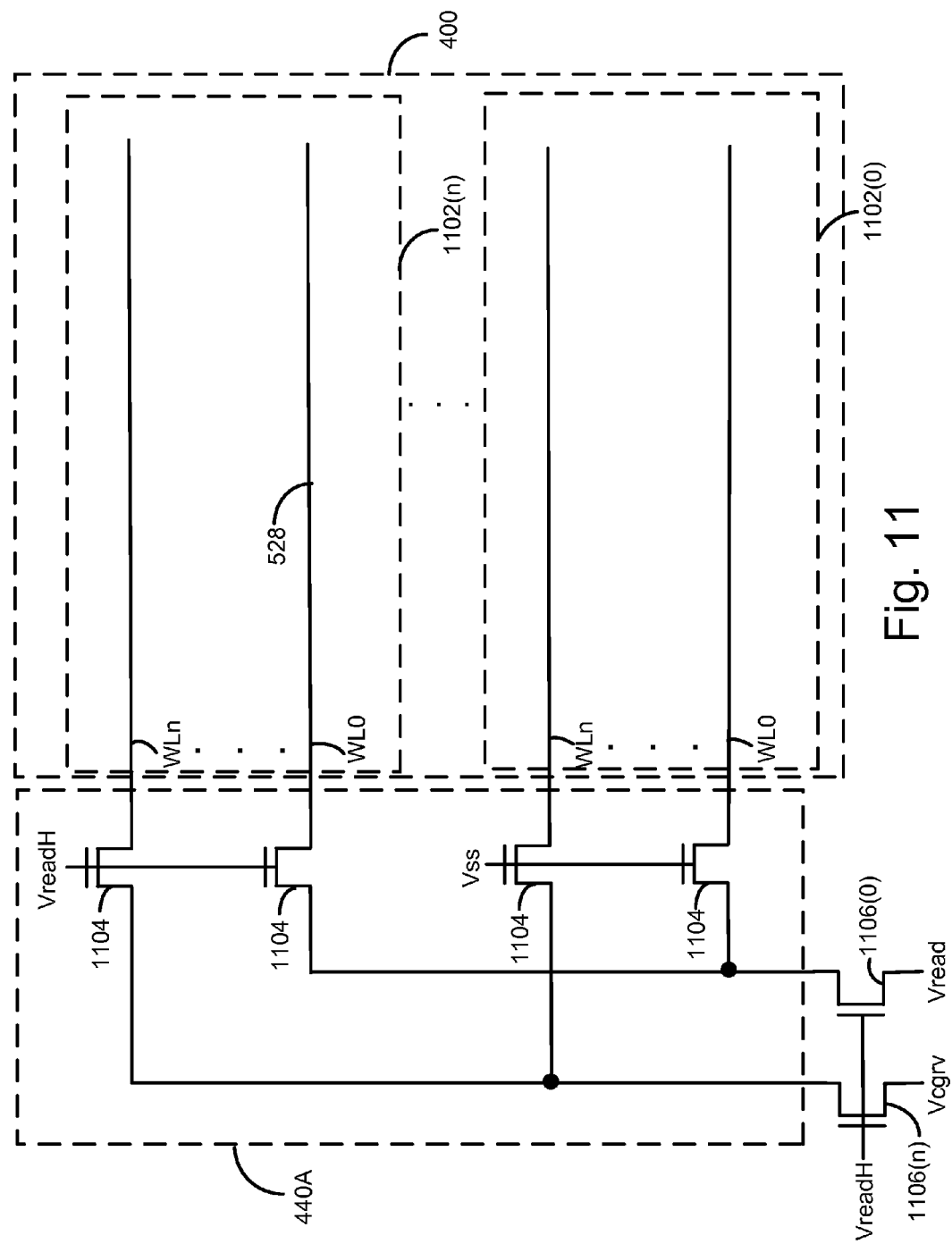
FIG. 11 depicts a schematic diagram of a portion of one embodiment of a memory array and associated row decoders.

FIG. 11 is a diagram of one embodiment of word lines 528 coupled to peripheral circuitry 240A. Because the word lines 528 are coupled to the peripheral circuitry 240A, the peripheral circuitry can provide or remove charges to the portion of the word line that is adjacent to the silicon nitride.

FIG. 11 provides more details of one embodiment of the memory array 400 and associated row decoders 440A of FIG. 4. The memory array has blocks 1102(0)-1102(n). Two blocks are depicted in FIG. 11, although there typically may be many more blocks 1102. The word lines (WL0 ... WLn) in a block 1102 are modeled as having some resistance and some capacitance. The row decoders 440A include a block select transistor connected 1104 to each word line. The voltage VreadH is applied to each block select transistor 1104 in block 1102(n) to select that block 1102(n). The voltage Vss is applied to each block select transistor 104 in other blocks (e.g., block 1102(0)), such that that other blocks are un-selected. Typically, there is one selected block and many unselected blocks. There may be one word line voltage transistor 1106(0)-1106(n) coupled to each word line. For example, transistor 106(0) is coupled to WL0 of each block 1102 through one of the word line select transistors 1104. Likewise, transistor 106(n) is coupled to WLn of each block 1102 through one of the word line select transistors 1104. Note that a given word line voltage transistor 1106 may be shared by different blocks. For example, if there are 64 word lines per block, there may be 64 word line voltage transistors 1106.

A reference voltage (Vcgrv) is applied to word line voltage transistor 1106(n) in order to apply Vcgry to the selected word line (WLn) of the selected block 1102(n). A read pass voltage (Vread) is applied to word line voltage transistor 1106(0) in order to apply Vread to the un-selected word line (WL0) of the selected block 1102(n). The voltage Vread may also be applied to other word line voltage transistors (not depicted in FIG. 11) in order to apply Vread to other un-selected word lines of the selected block 1102(n). Because Vss is applied to the block select transistors 1104 in the non-selected blocks, the voltages Vcgry and Vread do not pass to the word lines in the un-selected blocks. Note that other configurations could be used to provide the voltages to the word lines.

One embodiment disclosed herein includes a method of forming a memory device comprising the following. A plurality of lines of memory cells are formed. Individual memory cells have a charge storage region and a control gate. The charge storage regions each have sidewalls. A plurality of word lines are formed parallel to the lines of memory cells. Each word line is formed on the control gates of the memory cells in one of the lines. The word lines each have sidewalls. Oxide is formed that covers the sidewalls of the charge storage regions of the memory cells and that covers the sidewalls of the word lines. A nitride region is formed that is adjacent to the oxide that covers the sidewalls of the word lines but is not adjacent to the oxide that covers the sidewalls of the charge storage regions.

In one embodiment, the method of the previous paragraph also includes forming air gaps between adjacent pairs of the plurality of word lines. A portion of the air gaps is adjacent to the oxide that covers the sidewalls of the charge storage regions.

One embodiment disclosed herein includes a memory device comprising a plurality of lines of memory cells and a plurality of word lines each having sidewalls. The memory cells comprise a charge storage region having sidewalls and a control gate. Each of the word lines is associated with a line of the memory cells. Each of the word lines is coupled to the control gates of the memory cells with which it is associated. The memory device also includes first oxide regions that cover the sidewalls of the charge storage regions and second oxide regions that cover the sidewalls of the word lines. The memory device also includes nitride regions that cover the second oxide regions. The memory device also includes electrical isolation regions other than silicon nitride adjacent to the second oxide regions that cover the sidewalls of the charge storage regions.

In one embodiment, the electrical isolation regions includes air gaps. Each air gap is between a neighboring pair of the plurality of word lines. The air gaps are adjacent to second oxide regions.

One embodiment includes a method of forming a memory array that comprises the following. Lines of memory cell stacks are formed. Each line comprises a plurality of memory cells and a tungsten word line. Individual memory cells have a charge storage region. The lines of memory cell stacks have sidewalls. Silicon oxide is formed on the sidewalls of the lines of memory cell stacks. The silicon oxide has sidewalls. A sacrificial material is formed between the lines of memory cell stacks after forming the silicon oxide. The sacrificial material has a top surface that is below the word lines but above the charge storage regions. The sacrificial material has an etch selectively with respect to the silicon oxide. A portion of the silicon oxide remains exposed after forming the sacrificial material. Silicon nitride is formed on the sidewalls of the exposed silicon oxide. The sacrificial material is removed while leaving the silicon oxide on the sidewalls of the lines of memory cell stacks and the silicon nitride on the sidewalls of the silicon oxide adjacent to the word lines. Air gaps air formed between neighboring pairs of the lines of memory cell stacks.

One embodiment includes a memory device comprising a plurality of lines of memory cell stacks. Each of the lines comprises a plurality of memory cells and a tungsten word line. Individual memory cells have a charge storage region. The lines of memory cell stacks have sidewalls. The device further includes silicon oxide that covers the sidewalls of the memory cell stacks, and silicon nitride that covers portions of the silicon oxide that are adjacent to the tungsten word lines. The device further includes word line air gaps between neighboring pairs of the plurality of lines of memory cell stacks. The word line air gaps are adjacent to portions of the silicon oxide that is adjacent to the charge storage regions.

Herein, numerous examples of have been presented. However, it will be understood that other semiconductors might be used. The various process flows have the order of steps presented for convenience of discussion. However, it will be appreciated that the steps can be performed in a different order. The flowcharts do not describe all implant steps, forming contacts to bit lines and source lines, metallizations, forming vias, and passivation, as well as other portions of the manufacturing process known in the art. There are many ways to manufacture memory according to embodiments and, thus, the inventors contemplate that various methods other than that described can be used. For example, the charge trapping regions can be formed to have many different shapes.

The foregoing detailed description of embodiments has been presented for purposes of illustration and description. It is not intended to be exhaustive or to limit embodiments to the precise form disclosed. Many modifications and variations are possible in light of the above teaching. The described embodiments were chosen in order to best explain the principles and practical applications, to thereby enable others skilled in the art to best utilize the various embodiments and with various modifications as are suited to the particular use contemplated. It is intended that the scope be defined by the claims appended hereto.

What is claimed is:
1. A memory device comprising:
   a plurality of lines of memory cells, the memory cells comprising:
      a charge storage region having sidewalls; and
      a control gate;
   a plurality of word lines each having sidewalls, each of the word lines being associated with a line of the memory cells, each of the word lines being coupled to the control gates of the memory cells with which it is associated;
   first oxide regions that cover the sidewalls of the charge storage regions;
   second oxide regions that cover the sidewalls of the word lines;
   nitride regions that cover the second oxide regions; and
   electrical isolation regions other than silicon nitride adjacent to the first oxide regions that cover the sidewalls of the charge storage regions.

2. The memory device of claim 1, wherein the electrical isolation regions comprise:
   a plurality of air gaps, each air gap between a neighboring pair of the plurality of word lines, the air gaps being adjacent to first oxide regions.

3. The memory device of claim 1, wherein the word lines comprise tungsten.

4. The memory device of claim 1, wherein the charge storage region is a conductive floating gate.

5. The memory device of claim 1, wherein the charge storage region is a dielectric charge trapping region.

6. The memory device of claim 1, further comprising peripheral circuitry, wherein the word lines are electrically coupled to the peripheral circuitry.

7. The memory device of claim 1, wherein the first oxide regions and the second oxide regions comprise silicon oxide and the nitride regions comprise silicon nitride.

8. A memory device comprising:
   a plurality of lines of memory cell stacks, each line comprising a plurality of memory cells and a tungsten word line, individual memory cells having a charge storage region, the lines of memory cell stacks having sidewalls;
   silicon oxide that covers the sidewalls of the memory cell stacks;
   silicon nitride that covers portions of the silicon oxide that are adjacent to the tungsten word lines; and
   word line air gaps between neighboring pairs of the plurality of lines of memory cell stacks, the word line air gaps being adjacent to portions of the silicon oxide that is adjacent to the charge storage regions.

9. The memory device of claim 8, wherein the plurality of memory cells are arranged as NAND strings that are perpendicular to the word lines.

10. The memory device of claim 8, further comprising peripheral circuitry, wherein the word lines are electrically coupled to the peripheral circuitry.

11. The memory device of claim 8, wherein the charge storage region is a conductive floating gate.

12. The memory device of claim 8, wherein the charge storage region is a dielectric charge trapping region.

13. A method of forming a memory device, the method comprising:
    forming a plurality of lines of memory cells, the memory cells comprising:
        a charge storage region having sidewalls; and
        a control gate;
    forming a plurality of word lines each having sidewalls, each of the word lines being associated with a line of the memory cells, each of the word lines being coupled to the control gates of the memory cells with which it is associated;
    forming first oxide regions that cover the sidewalls of the charge storage regions;
    forming second oxide regions that cover the sidewalls of the word lines;
    forming nitride regions that cover the second oxide regions; and
    forming electrical isolation regions other than silicon nitride adjacent to the first oxide regions that cover the sidewalls of the charge storage regions.

14. The method of claim 13, wherein forming the electrical isolation regions comprises:
    forming air gaps between adjacent pairs of the plurality of word lines, a portion of the air gaps being adjacent to the oxide that covers the sidewalls of the charge storage regions.

15. The method of claim 13, wherein forming the nitride regions that cover the second oxide regions comprises:
    forming a sacrificial material between the lines of memory cells after forming the first oxide regions, wherein the sacrificial material covers the first oxide regions that cover the sidewalls of the charge storage regions but does not cover the second oxide regions that cover the sidewalls of the word lines;
    forming the nitride regions on the second oxide regions that cover the sidewalls of the word lines with the sacrificial material in place; and
    removing the sacrificial material while leaving the nitride regions in place.

16. The method of claim 15, wherein the sacrificial material comprises silicon, nitrogen, and hydrogen.

17. The method of claim 13, wherein forming the plurality of word lines comprises forming the plurality of word lines from tungsten.

18. The method of claim 13, wherein forming the plurality of lines of memory cells comprises forming the charge storage regions comprising a dielectric charge trapping region.

19. The method of claim 13, wherein forming the plurality of lines of memory cells comprises forming the charge storage regions comprising a conductive floating gate.

* * * * *